(12) United States Patent
Sultan et al.

(10) Patent No.: US 7,176,095 B1
(45) Date of Patent: Feb. 13, 2007

(54) BI-MODAL HALO IMPLANTATION

(75) Inventors: Akif Sultan, Austin, TX (US); David Wu, Austin, TX (US); Wen-Jie Qi, Austin, TX (US); Mark Fuselier, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 330 days.

(21) Appl. No.: 10/790,939

(22) Filed: Mar. 1, 2004

(51) Int. Cl.
*H01L 21/336* (2006.01)

(52) U.S. Cl. ............... 438/302; 438/306; 257/206; 257/E21.618; 257/E21.633

(58) Field of Classification Search ........... 438/199, 438/232, 279, 302, 147, 181, 185, 194, 289, 438/306, 373, 548; 257/206
See application file for complete search history.

(56) References Cited

U.S. PATENT DOCUMENTS

| | | | |
|---|---|---|---|
| 5,227,321 A | 7/1993 | Lee et al. ................ 437/44 |
| 5,580,804 A | 12/1996 | Joh ....................... 438/231 |
| 6,030,871 A | 2/2000 | Eitan ..................... 438/276 |
| 6,114,211 A | 9/2000 | Fulford et al. ........... 448/305 |
| 6,489,223 B1 | 12/2002 | Hook et al. .............. 438/524 |
| 6,566,204 B1 * | 5/2003 | Wang et al. ............. 438/286 |
| 6,620,679 B1 | 9/2003 | Tzeng et al. ............. 438/250 |
| 6,747,325 B2 * | 6/2004 | Shih ...................... 257/408 |
| 6,784,062 B2 * | 8/2004 | Cho et al. ............... 438/302 |
| 6,828,202 B1 | 12/2004 | Horch .................... 438/302 |
| 2003/0032231 A1 | 2/2003 | Efland et al. ............ 438/200 |

OTHER PUBLICATIONS

U.S. Appl. No. 10/693,016, filed Nov. 24, 2003, Scott Goad et al.
Stanley Wolf and Richard N. Tauber; *Silicon Processing for the VLSI Era*, vol. 3—*The Submicron MOSFET*; pp. 226-232, 240, 309-311 and 621-622; 1995.
Terence B. Hook et al.; *High-Performance Logic and High-Gain Analog CMOS Transistors Formed by a Shadow-Mask Technique With a Single Implant Step*; IEEE Transactions on Electron Devices, vol. 49, No. 9, Sep. 2002; pp. 1623-1627.
U.S. Appl. No. 10/883,925, filed Jul. 2, 2004, Edward E. Ehrichs.

* cited by examiner

*Primary Examiner*—Quoc Hoang
(74) *Attorney, Agent, or Firm*—Timothy M. Honeycutt

(57) ABSTRACT

Methods of fabricating halo regions are provided. In one aspect, a method is provided of fabricating a first halo region and a second halo region for a circuit device of a first conductivity type and having a gate structure with first and second sidewalls. The first halo region of a second conductivity type is formed by implanting the substrate with impurities in a first direction toward the first sidewall of the gate structure. The second halo region of the second conductivity type is formed by implanting the substrate with impurities in a second direction toward the second sidewall of the gate structure. The first and second halo regions are formed without implanting impurities in a direction substantially perpendicular to the first and second directions.

12 Claims, 6 Drawing Sheets

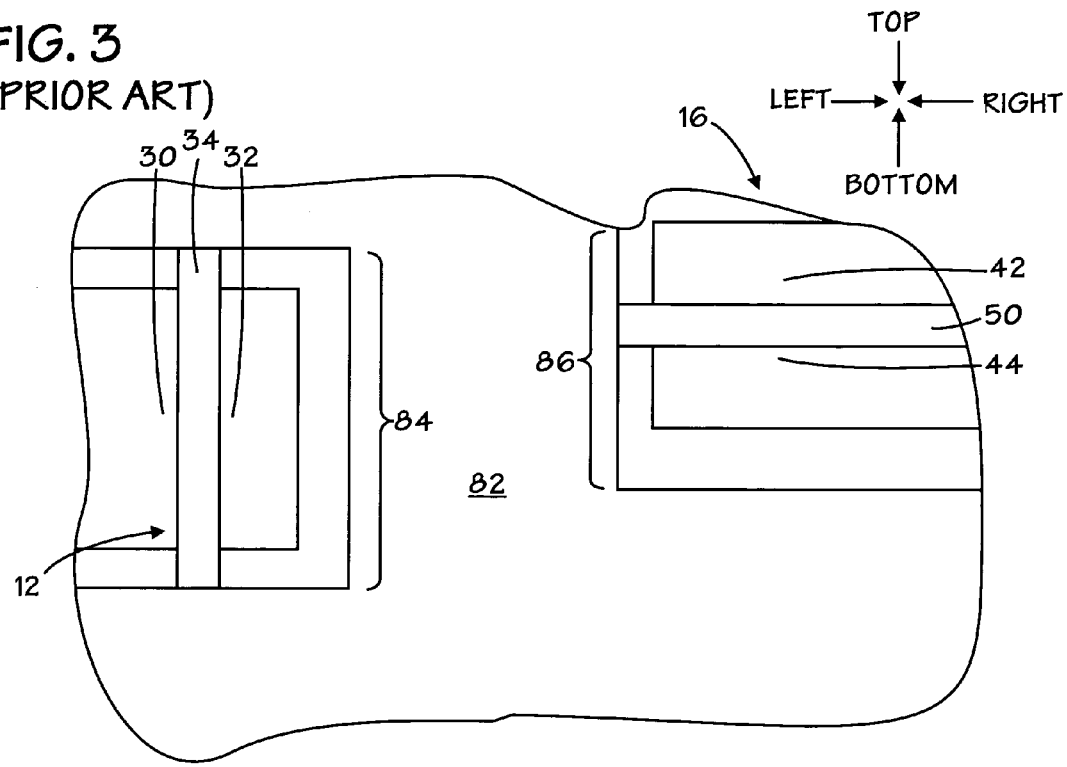
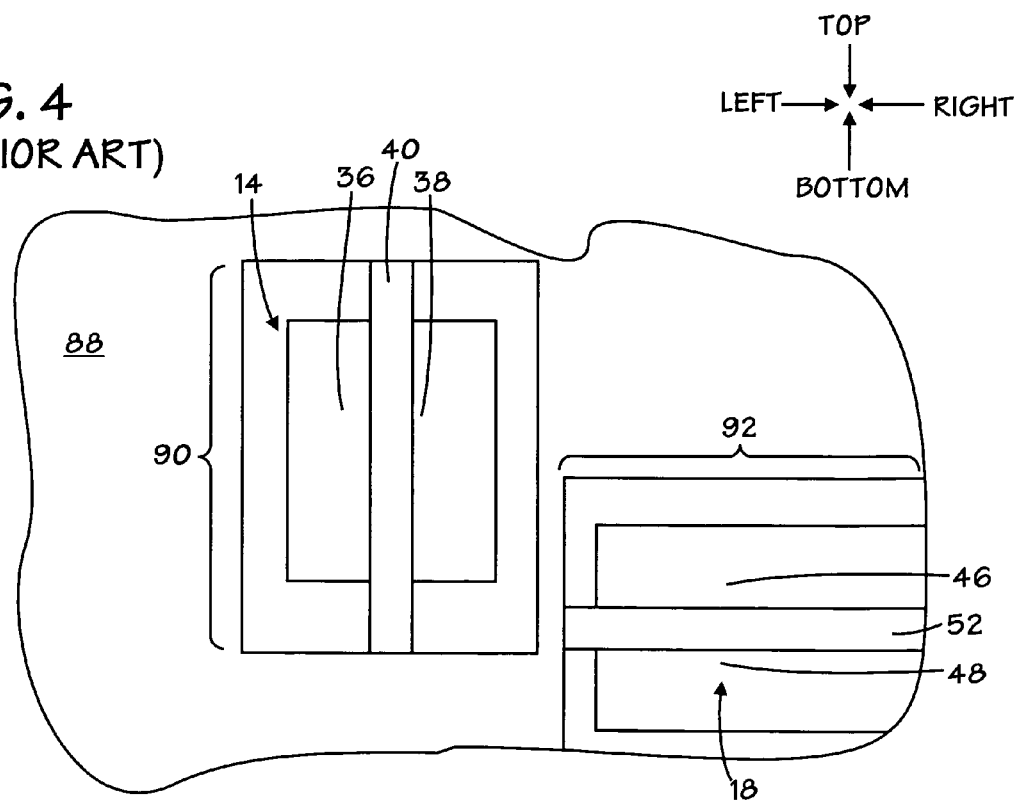

BI-MODAL HALO IMPLANTATION

BACKGROUND OF THE INVENTION

1. Field of the Invention

This invention relates generally to semiconductor processing, and more particularly to halo structures and methods of making the same.

2. Description of the Related Art

A typical field effect transistor implemented on a semiconductor substrate consists of a gate dielectric layer-gate electrode stack positioned on the substrate, and opposing source/drain impurity regions positioned in the substrate below the stack. The lateral separation between the pn junctions of the source/drain regions generally defines the channel length of the transistor. Some source/drain regions include extension regions that project laterally into the channel beneath the gate. When lightly doped, these extension structures are sometime called lightly doped drains ("LDD"). The purpose of the LDD structures is to provide a region of lighter doping beneath the gate electrode to reduce the drain junction potential.

Scaling of field effect transistor devices has historically been, and continues to be a fundamental goal in the semiconductor fabrication industry. The continual drive toward higher circuit density has been fueled by demands from ordinary consumers, industry, government and the military for ever increasing speed, capability and miniaturization of electronic products, as well as the desire of semiconductor manufacturers to reduce manufacturing costs. Scaling efforts have thus far been highly successful. Two micron processing, considered state of the art a little more than a decade ago, has given way to sub-micron processing.

As in many aspects of semiconductor processing, current efforts to scale transistor geometry involve a set of trade-offs between higher packing density, improved device performance, and short channel effects. As process technologies scaled below about 2.0 µm, a series of design difficulties arose stemming from the semiconductor physics associated with short-channel devices. Hot carrier effects and punchthrough become much more problematic in short channel devices, such as modern field effect transistors in sub-2.0 µm processing. Without compensatory processing techniques, short channel effects can either reduce device performance or lead to device failure or both.

Halo structures have been used for several years in n-channel, p-channel and CMOS technologies as a means of controlling short channel effects in sub-0.5 µm critical dimension processing. A conventional halo structure consists of an implanted impurity region positioned lateral to the LDD of each source/drain region and provided with the same conductivity type as the channel. The conventional method of fabricating a halo structure entails a so-called "quad" large-angle-tilted ("LAT") ion implant that positions the halo structure around and under the vertical junctions of both the LDD and the overlapping heavier doped portion of the source/drain region. Two masking steps are used. A first mask is patterned to expose all p-channel or all n-channel transistors. At this point, four implants are performed, one from each major compass point, e.g., North, South, East and West. As most transistors are aligned along two orthogonal axes, the goal of the quad implant is to direct ions toward the edges of the gates of the all of the transistors aligned along the two axes.

Following the first quad implant, the first mask is stripped and a second mask is patterned with openings to expose the formerly masked transistors and to cover the halo-implanted transistors. Another quad implant is performed and the second mask is stripped.

As described more below, the conventional quad implant and masking process can produce what is essentially an unwanted overdoping of portions of the transistor source/drain regions. The problem stems from the fact that only two implants for a given quad implant send ions beneath the gate into the channel where the benefits of halos are realized. The two implants that are directed parallel, as opposed to perpendicular, to the gate edges excessively counterdope the source/drain regions and do not place the halo ions where there are needed—in the channel to the right and left of the LDD'S. The counterdoped regions can increase junction capacitance and reduce device performance.

The present invention is directed to overcoming or reducing the effects of one or more of the foregoing disadvantages.

SUMMARY OF THE INVENTION

In accordance with one aspect of the present invention, a method is provided of fabricating a first halo region and a second halo region for a circuit device of a first conductivity type and having a gate structure with first and second sidewalls. The first halo region of a second conductivity type is formed by implanting the substrate with impurities in a first direction toward the first sidewall of the gate structure. The second halo region of the second conductivity type is formed by implanting the substrate with impurities in a second direction toward the second sidewall of the gate structure. The first and second halo regions are formed without implanting impurities in a direction substantially perpendicular to the first and second directions.

In accordance with another aspect of the present invention, a method is provided of fabricating halo regions for a first group of transistors on a substrate substantially aligned with a first axis and a second group of transistors on the substrate substantially aligned with a second axis that is substantially perpendicular to the first axis. Halo regions for the first group of transistors are formed by implanting the substrate with impurities in a first direction substantially perpendicular to the first axis, and implanting the substrate with impurities in a second direction substantially opposite the first direction and substantially perpendicular to the first axis, and without implanting impurities in a direction substantially parallel to the first axis. Halo regions for the second group of transistors are formed by implanting the substrate with impurities in a third direction substantially perpendicular to the second axis, and implanting the substrate with impurities in a fourth direction substantially opposite the third direction and substantially perpendicular to the second axis, and without implanting impurities in a direction substantially parallel to the second axis.

In accordance with another aspect of the present invention, a method is provided of fabricating first and second halo regions for a n-channel transistor that has a first gate structure and third and fourth halo regions for a p-channel transistor that has a second gate structure. The p-channel transistor is masked and the first halo region is formed extending beneath the first gate structure by implanting impurities in a first direction toward a first sidewall of the first gate structure. The second halo region is formed extending beneath the first gate structure by implanting impurities in a second direction substantially opposite to the first direction toward a second sidewall of the first gate structure. The p-channel transistor is unmasked and the n-channel transistor is masked. The third halo region is formed by implanting impurities in the first direction toward a first sidewall of the second gate structure. The fourth halo region is formed by implanting impurities in the second direction toward a second sidewall of the second gate structure. The first, second, third and fourth halo regions are formed without implanting impurities in a direction substantially perpendicular to the first and second directions.

In accordance with another aspect of the present invention, a method of manufacturing is provided that includes forming first and second halo regions for each of a first group of n-channel transistors aligned along a first axis by implanting impurities beneath gate structures of each of the first group of n-channel transistors from first and second substantially opposite directions toward opposite sides of the gate structures of the first group of n-channel transistors. Third and fourth halo regions are formed for each of a second group of n-channel transistors aligned along a second axis substantially perpendicular to the first axis by implanting impurities beneath gate structures of each of the second group of n-channel transistors from third and fourth substantially opposite directions toward opposite sides of the gate structures of the second group of n-channel transistors. First and second halo regions are formed for each of a first group of p-channel transistors aligned along the first axis by implanting impurities beneath gate structures of each of the first group of p-channel transistors from first and second substantially opposite directions toward opposite sides of the gate structures of the first group of p-channel transistors. Third and fourth halo regions are formed for each of a second group of p-channel transistors aligned along the second axis by implanting impurities beneath gate structures of each of the second group of p-channel transistors from third and fourth substantially opposite directions toward opposite sides of the gate structures of the second group of p-channel transistors. The first and second halo regions of the first group of n-channel transistors and the first group of p-channel transistors are formed without implanting impurities in a direction substantially perpendicular to the first and second directions, and the third and fourth halo regions of the second group of n-channel transistors and the second group of p-channel transistors are formed without implanting impurities in a direction substantially perpendicular to the third and fourth directions.

BRIEF DESCRIPTION OF THE DRAWINGS

The foregoing and other advantages of the invention will become apparent upon reading the following detailed description and upon reference to the drawings in which:

FIG. 3 is a plan view like FIG. 1 but depicts conventional masking and quad halo implantation of two of the field effect transistors FIG. 4 is a plan view like FIG. 3 but depicts conventional masking and quad halo implantation of two other of the field effect transistors;

DETAILED DESCRIPTION OF SPECIFIC EMBODIMENTS

Figure 1:
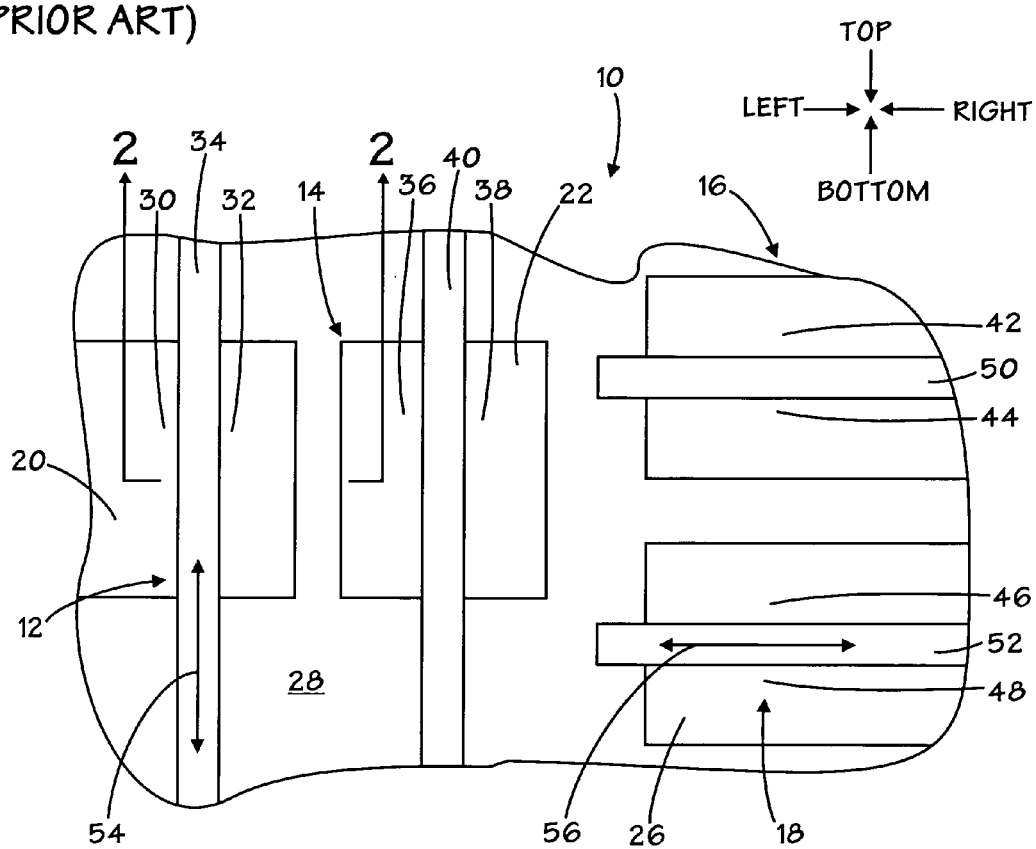
FIG. 1 is a plan view of a conventional integrated circuit that includes four field effect transistors.

In the drawings described below, reference numerals are generally repeated where identical elements appear in more than one figure. Turning now to the drawings, and in particular to FIG. 1, therein is shown a plan view of a conventional integrated circuit 10 that includes four field effect transistors 12, 14, 16 and 18. The field effect transistors 12, 14, 16 and 18 are implemented on active regions 20, 22, 24 and 26 that are circumscribed by an isolation structure 28. The field effect transistor 12 consists of source/drain regions 30 and 32 and an overlying gate electrode 34. The field effect transistor 14 similarly consists of source/drain regions 36 and 38 and a gate electrode 40 and the field effect transistors 16 and 18 include respective source/drain regions 42 and 44, 46 and 48 and overlying gate electrodes 50 and 52. For the purposes of this illustration, the field effect transistors 12 and 16 are configured as n-channel transistors and the field effect transistors 14 and 18 as p-channel transistors. Note that the field effect transistors 12 and 14 are oriented along the same general direction, that is, in such a way that the gate electrodes 34 and 40 thereof are generally parallel to an axis 54. In contrast, the field effect transistors 16 and 18 are aligned along another axis 56 that is approximately orthogonal to the axis 54. It turns out that this type of alignment of field effect transistors in conventional logic devices is relatively common.

Halo regions are formed in the active regions 20, 22, 24 and 26 by performing what is generally termed a "quad" halo implant. In essence, the integrated circuit 10 is masked in such a way that all of the n-channel transistors, for example the n-channel transistors 12 and 16, are exposed while the p-channel transistors 14 and 18 are masked and halo implants are performed from four directions as generally noted by the arrows TOP, RIGHT, BOTTOM and LEFT in FIG. 1. This first mask (not shown in FIG. 1) is subsequently stripped and another mask (also not shown in FIG. 1) is formed to cover the n-channel transistors 12 and 16 while exposing the p-channel transistors 14 and 18 and the quad implant is again performed.

Figure 2:
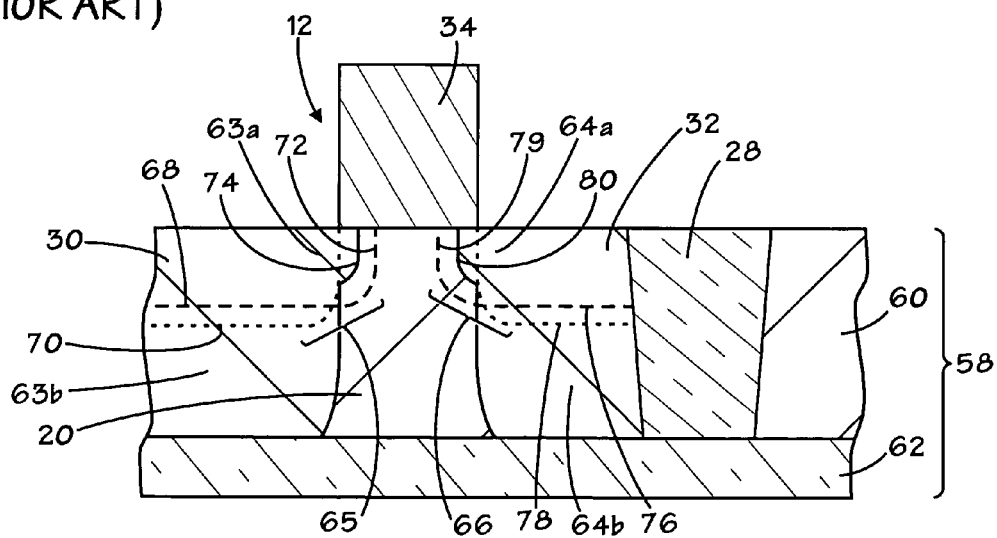
FIG. 2 is a cross-sectional view of FIG. 1 taken at section 2—2.

The resulting halo regions for the transistor 12 may be seen by referring now to FIG. 2, which is a cross-sectional view of FIG. 1 taken at section 2—2. It should be understood that the structure described in FIG. 2 will be illustrative of the halo formation for the other transistors 14, 16 and 18, albeit with an impurity type, p-type or n-type, as the case may be that is appropriate for the particular transistor. The transistor 12 is depicted as being implemented on a semiconductor-on-insulator substrate 58 that consists of a silicon layer 60 formed on an oxide layer 62. The source/drain region 30 is implemented with an extension region 63a and an overlapping deep and more heavily-doped region 63b. The source/drain region 32 is implemented with an extension region 64a and an overlapping deep and more heavily-doped region 64b. Note that only a portion of the insulating structure 28 is visible due to the selection of the section 2—2 for FIG. 2.

Halo regions 65 and 66 are formed in the active region 20 using the aforementioned quad implant. The halo region 65 consists of a region 68 and a somewhat vertically overlapping region 70. The region 68 is formed during the LEFT direction implant. The region 68 includes a portion 72 that projects laterally beyond the junction 74 of the source/drain region 30. The goal of the halo implant process is to establish the laterally projecting portion 72 that does indeed extend beyond the junction 74 beneath the gate 34. The halo region 66 is similarly a composite of regions 76 and 78 that are positioned in and around the source/drain region 32 such that a portion 79 of the region 76 projects laterally beneath the gate 34 beyond the junction 80 of the source/drain region 32. The regions 76 and 78 of the halo region 66 are established by the combination of the RIGHT, TOP and BOTTOM direction implants as indicated by the arrows in FIG. 1. The formation of the regions 70 and 78 is an unwanted by-product of the conventional method of forming halo regions. In essence, the regions 70 and 78 are established by the TOP and BOTTOM direction implants of the conventional quad implant. Because the TOP and BOTTOM direction implants do not implant ions beneath the edges of the gate electrode 34, they do not establish impurities beneath the gate at 34 and beyond the junctions 74 and 80 of the source/drain regions 32. The regions 70 and 78 thus constitute areas of undesirable counter doping of the source/drain regions 30 and 32 that present difficulties in terms of higher junction capacitance and overall device performance.

The conventional quad implant method of establishing halos for the field effect transistors 12, 14, 16 and 18 are described in more detail in conjunction with FIGS. 3 and 4. Referring initially to FIG. 3, a mask 82 is formed with openings 84 and 86 that expose the n-channel field effect transistors 12 and 16. Note that the mask 82 covers the field effect transistors 14 and 18, which are thus not visible in FIG. 3. At this point, a quad halo implant of p-type impurity is depicted by the TOP, RIGHT, BOTTOM and LEFT arrows to establish halo regions in and around the source/drain regions 30 and 32 but beneath the gate 34 of the transistor 12, and in and around the source/drain regions 42 and 44 but beneath the gate electrode 50 of the transistor 16. As described above, the TOP and BOTTOM direction implants will have a deleterious effect on the halo formation for the transistor 12, and the LEFT and RIGHT direction implants will have the similar detrimental effect on the halo formation for the transistor 16. Following the quad implant, the mask 82 is stripped.

Referring now to FIG. 4, a second mask 88 is formed with openings 90 and 92 that expose the transistors 14 and 18 but not the transistors 12 and 16, which are not visible. To establish halo regions in and around the source/drain regions 36 and 38 but beneath the gate electrode 40 of the device 14 and in and around the source/drain regions 46 and 48 but beneath the gate electrode 52 of the transistor 18. In this case, the TOP and BOTTOM direction implants result in the formation of the unwanted over-doped portions of the halos beneath the gate 40 that correspond to the regions 70 and 78 depicted in FIG. 2. In contrast, the LEFT and RIGHT direction implants produce the same undesirable over-doped portions of the halos beneath the gate electrode 52, albeit in a direction shifted 90° from the unwanted over-doped regions for the device 14.

Figure 5:
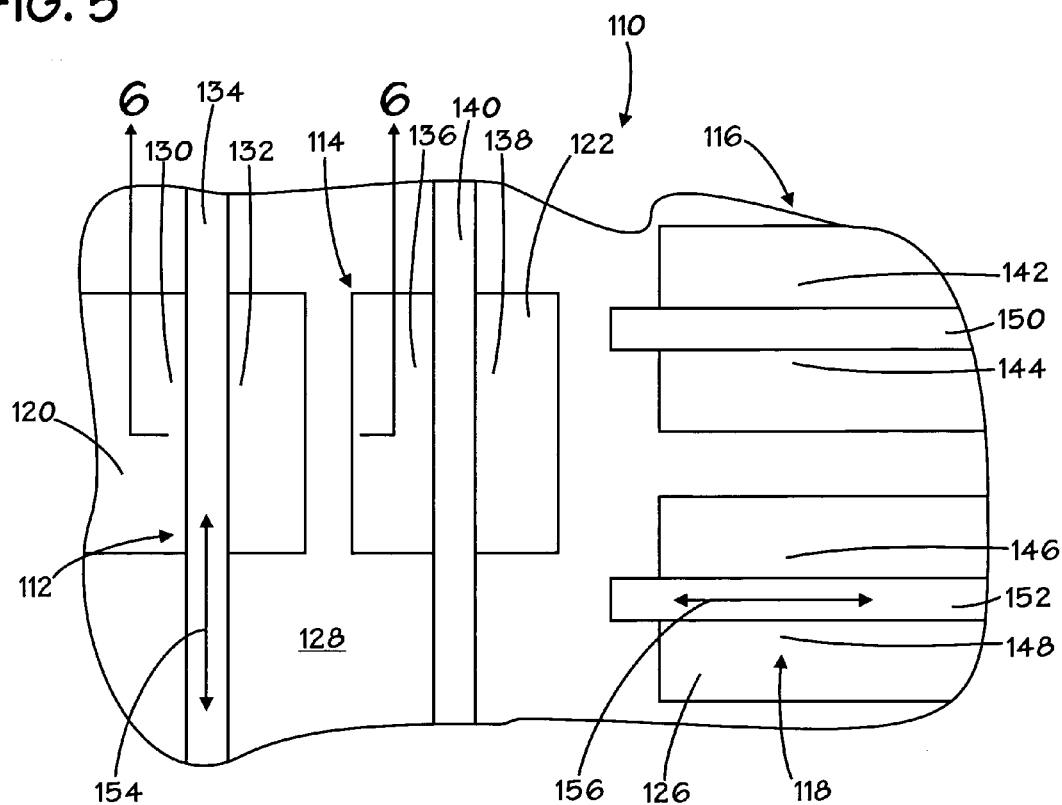
FIG. 5 is a plan view of an exemplary embodiment of an integrated circuit that has at least four circuit devices in accordance with the present invention.
Figure 6:
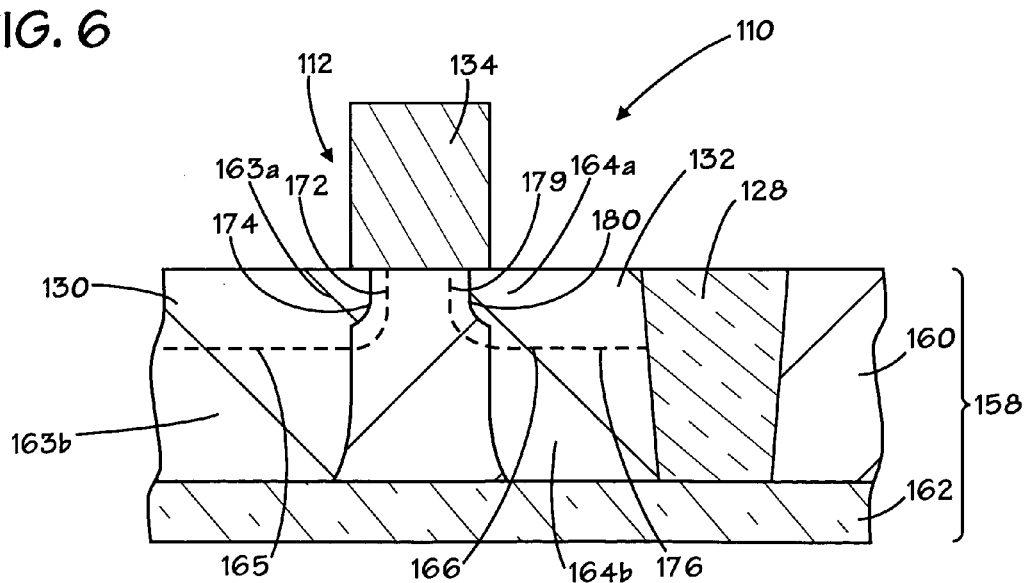
FIG. 6 is a cross-sectional view of FIG. 5 taken at section 6—6 in accordance with the present invention.

An exemplary method in accordance with the present invention that solves the difficulties associated with the conventional halo implantation process may be understood by referring now to FIGS. 5, 6, 7, 8, 9 and 10 and initially to FIG. 5. FIG. 5 is a plan view of an exemplary embodiment of an integrated circuit 110. The integrated circuit 110 may be fabricated with a myriad of different types of circuit structures designed to perform a variety of functions. Four exemplary circuit devices 112, 114, 116 and 118 are depicted. The devices 112, 114, 116 and 118 are depicted as field effect transistors. However, they may be virtually any device that may benefit from halo implantation. The transistors 112, 114, 116 and 118 are formed on respective active regions 120, 122, 124 and 126 that are circumscribed by an isolation structure 128. The active regions 120, 122, 124 and 126 may be composed of a variety of semiconductor materials, such as, for example, silicon, silicon germanium, germanium, laminates of these or the like. The isolation structure 128 may be field oxide, trench isolation or other well-known electrical isolation structures.

The field effect transistor 112 consists of source/drain regions 130 and 134 formed in the active region 120 and an overlying gate structure 134. The phrase "source/drain region(s)" is used herein to describe a region that may serve as either a source or a drain. The skilled artisan will appreciate that a source/drain region may function as a source or a drain depending upon how it is interconnected with interconnects and other conductors. The transistor 114 similarly consists of source/drain regions 136 and 138 and a gate structure 140. In like fashion, the transistors 116 and 118 consist of respective source/drain regions 142 and 144 and 146 and 148, and respective overlying gate structures 150 and 152. In this illustrative embodiment, the transistors 112 and 116 are implemented as n-channel and the transistors 114 and 118 are implemented as p-channel. However, flexibility in the selection of impurity type is envisioned.

Note that the transistors 112 and 114 are oriented along an axis 154 that is superimposed graphically over the gate structure 134. The devices 112 and 114 are oriented along the axis 154 in that the long axes of the gate structures 134 and 140 are generally parallel to the axis 154. The devices 116 and 118 are positioned generally orthogonally to the devices 112 and 114. In other words, the devices 116 and 118 are generally oriented along an axis 156 that is substantially orthogonal to the axis 154. That is not to say that all of the circuit devices on the integrated circuit 110 are oriented along either of the axes 154 or 156. However, the benefits of the present invention may be realized for those groups of devices that are oriented along two axes that are substantially orthogonal to one another.

Halo regions are formed for each of the transistors 112, 114, 116 and 118 in accordance with the present invention. The structure of the halo regions for the transistor 112 may be understood by referring now to FIG. 6, which is a cross-sectional view of FIG. 5 taken at 6—6. Note preliminarily that FIG. 6 reveals that the integrated circuit 110 may be implemented on a semiconductor-on-insulator substrate 158 that consists of a semiconductor layer 160 and an underlying insulator layer 162. The semiconductor layer 160 is subdivided into the active regions 120, 122, 124 and 126 by the isolation structure 128. Note also that the selection of the section 6—6 reveals only a portion of the isolation structure 128. The insulator layer 162 may be composed of well-known insulator materials, such as, for example, oxide, silicon nitride, sapphire, laminates of these or the like. Bulk semiconductor substrates may be used as well. The source/drain region 130 is implemented with an extension region 163*a* and an overlapping deep and more heavily-doped region 163*b*. The source/drain region 132 is implemented with an extension region 164*a* and an overlapping deep and more heavily-doped region 164*b*. Optionally, other than multi-graded source/drains may be used.

Halo regions 165 and 166 are established in and around the source/drain regions 130 and 132. The halo region 165 includes a laterally projecting portion 172 that projects laterally beneath the gate 134 away from a junction 174 of the source/drain region 130. The halo region 166 similarly includes a laterally projecting portion 179 that extends beneath the gate 134 away from a junction 180 of the source/drain region 132. Note that the junctions 174 and 180 may be source/drain extension region-to-channel junctions or LDD-to-channel junctions in the event the source/drain regions 130 and 132 are formed with either source/drain extensions or LDD's, or another type of junction in the event the source/drain regions 130 and 132 are formed with another grading scheme. Significantly though, the halo regions 165 and 166 do not include the unwanted over-doped regions like the regions 70 and 78 depicted in FIG. 2 that impede device performance and contribute little to the benefits of a halo region.

Figure 7:
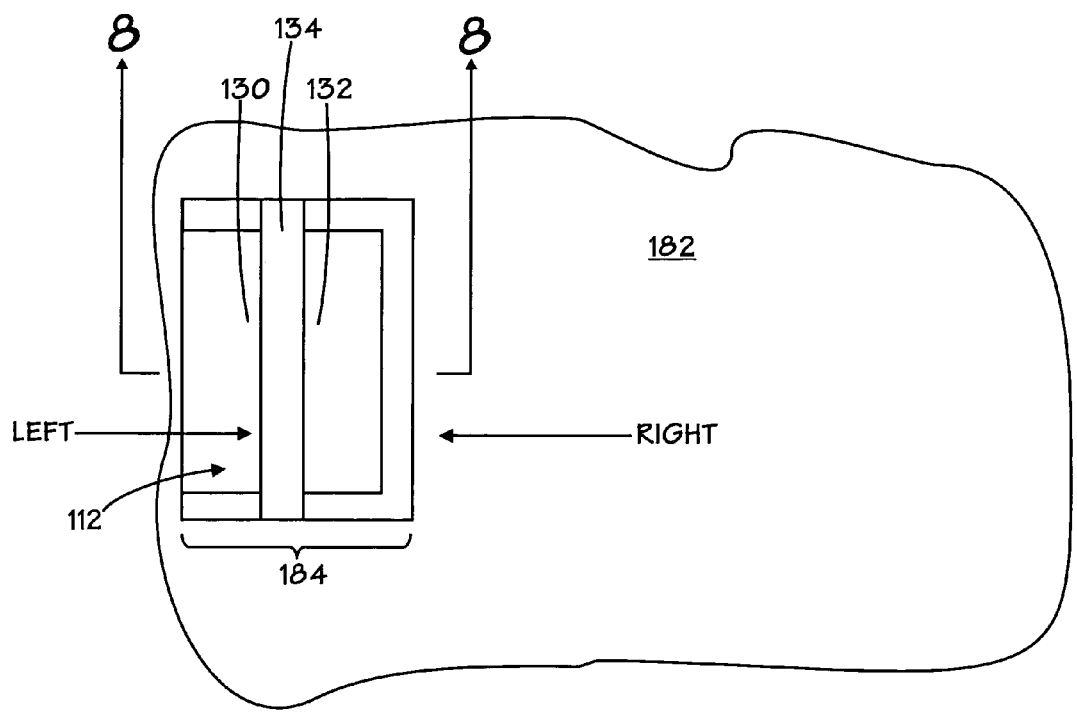
FIG. 7 is a plan view like FIG. 5 but depicts masking and bi-modal halo implantation of one the circuit devices in accordance with the present invention.
Figure 8:
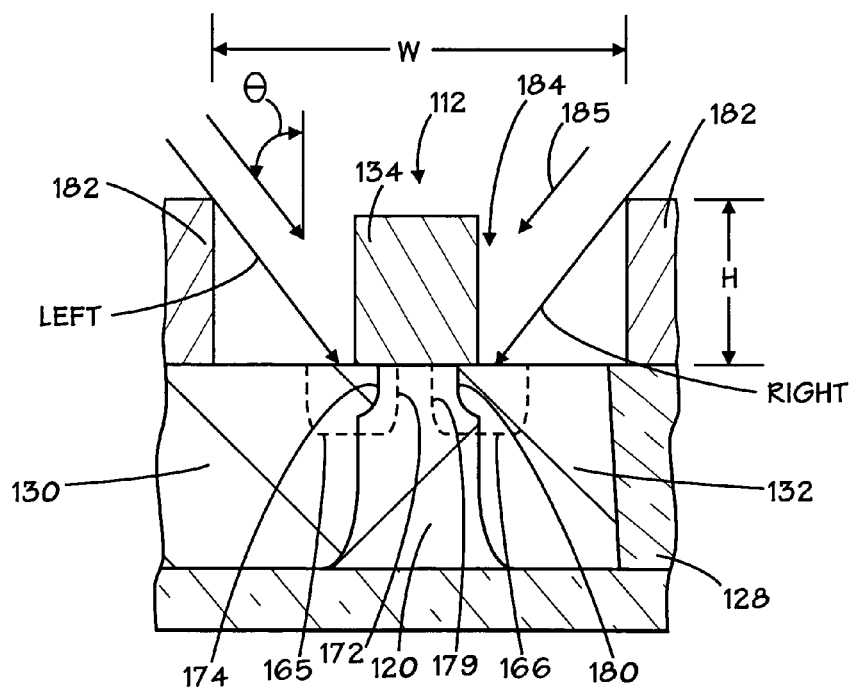
FIG. 8 is a cross-sectional view of FIG. 7 taken at section 8—8 in accordance with the present invention.

An exemplary method for fabricating the halo regions 165 and 166 and similar halo regions for the other devices 114, 116 and 118 may be understood by referring now to FIGS. 7, 8, 9, 10 and 11 and initially to FIG. 7. A mask 182 is formed with an opening 184 that exposes the transistor 112. Referring now also to FIG. 8, which is a cross-sectional view of FIG. 7 taken at section 8—8, the opening 184 is patterned with a width W that is selected in conjunction with a height H of the mask 182 to permit tilted angle implantation without undue shadowing of the active region 120. Note that just a portion of the isolation structure 128 is visible in FIGS. 7 and 8. The goal of the halo implant process is to establish the halo regions 165 and 166 with the laterally projecting portions 172 and 179 positioned well to the left and right of the junctions 174 and 180 of the source/drain regions 130 and 132. Impurity ions are implanted from the LEFT and RIGHT directions, but notably, not from the TOP and BOTTOM directions, as would be the case if conventional processing were used. The implants from the left and right directions may be performed at an implant angle θ, which is advantageously about 15 to 45° from vertical. The impurity ions 185 will advantageously have an impurity type, e.g., p-type or n-type, that is opposite to the impurity type of the source/drain regions 130 and 132. Thus, for the example of the transistor 112, which is implemented as an n-channel transistor, the impurity ions 185 may be boron, $BF_2$, indium or the like. The dosage may be about 1E13 to 1E14 $cm^{-2}$ and the energy may be about 10 to 20 keV. The energy for the implants will typically be proportional to the mass of the species. Following the bi-modal implantation, the mask 182 may be stripped using ashing, solvent stripping, combinations of these or the like.

Figure 9:
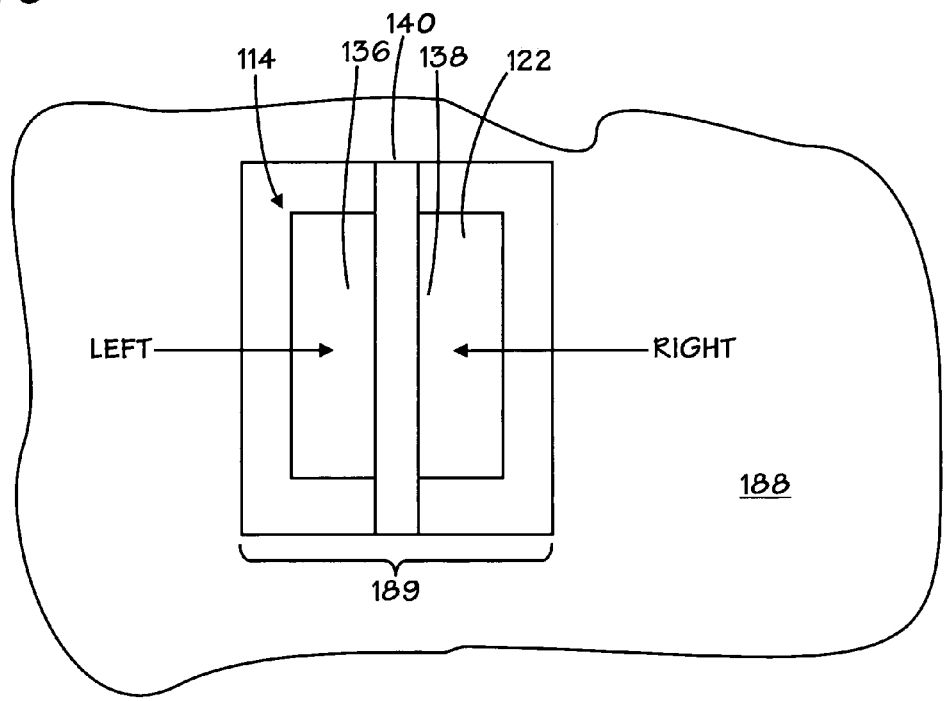
FIG. 9 is a plan view like FIG. 7 but depicts masking and bi-modal halo implantation of another of the circuit devices in accordance with the present invention.

Referring now to FIG. 9, a second mask 188 is formed with an opening 189 patterned to expose the transistor 114. As with the opening 184 depicted in FIGS. 7 and 8, the opening 189 will be patterned with a width and the mask 188 with a height that does not unduly shadow the active region 122 during halo implantation. After the mask 188 is patterned, halo implants from the LEFT and RIGHT directions are performed to establish halo regions in and around the source/drain regions 136 and 138 but laterally projecting beneath the gate electrode 140. The halo regions are not visible in FIG. 9, but will be substantially identical to the halo regions 165 and 166 depicted in FIG. 8. As the transistor is implemented as p-channel, an n-type impurity is used, such as phosphorus, aresnic, antimony or the like. The dosage may be about 1E13 to 1E14 $cm^{-2}$ and the energy about 10 to 30 keV. Again, TOP and BOTTOM direction halo implants are not performed and thus unwanted halo portions such as those designated 70 and 78 depicted in FIG. 2 will not be produced. Following the implants, the mask 188 may be stripped using the techniques described elsewhere herein.

Figure 10:
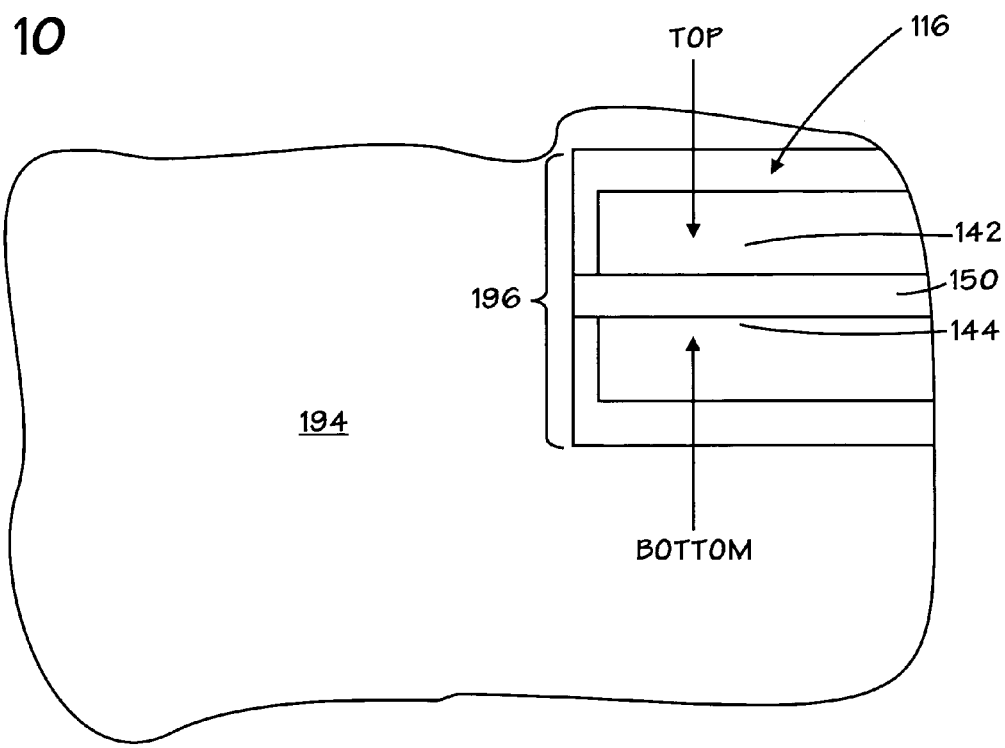
FIG. 10 is a plan view like FIG. 9 but depicts masking and bi-modal halo implantation of another of the circuit devices in accordance with the present invention.

Referring now to FIG. 10, another mask 194 is formed with an opening 196 that exposes the transistor 116. Since the transistor 116 is oriented generally orthogonally to the transistors 112 and 114, the halo regions for the transistor 116 are formed by performing implants from the TOP and BOTTOM directions using the aforementioned parameters, but not from the RIGHT and LEFT directions. Thus, the halo regions will be established in and around the source/drain regions 142 and 144 beneath the gate electrode 150, and will generally be configured like the halo regions 165 and 166 depicted in FIG. 6, albeit in the context of the transistor 116. Following the TOP and BOTTOM implants, the mask 194 may be stripped using the techniques described elsewhere herein.

Figure 11:
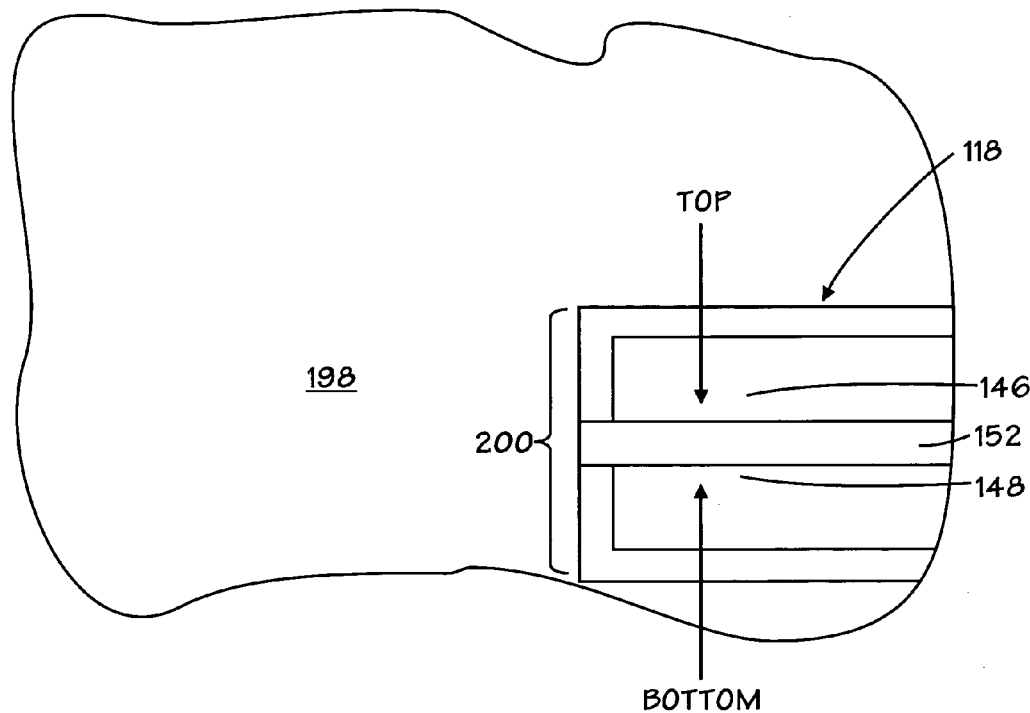
FIG. 11 is a plan view like FIG. 10 but depicts masking and bi-modal halo implantation of another of the circuit devices in accordance with the present invention.

Referring now to FIG. 11, another mask 198 is formed with an opening 200 that exposes the transistor 118. Once the mask 198 is formed, halo regions are established in and around the source/drain regions 146 and 148 but beneath the gate electrode 152 by performing implants in the TOP and BOTTOM directions using the aforementioned parameters, but not LEFT and RIGHT directions. Following the implants, the mask 198 may be stripped by techniques described elsewhere herein.

Figure 12:
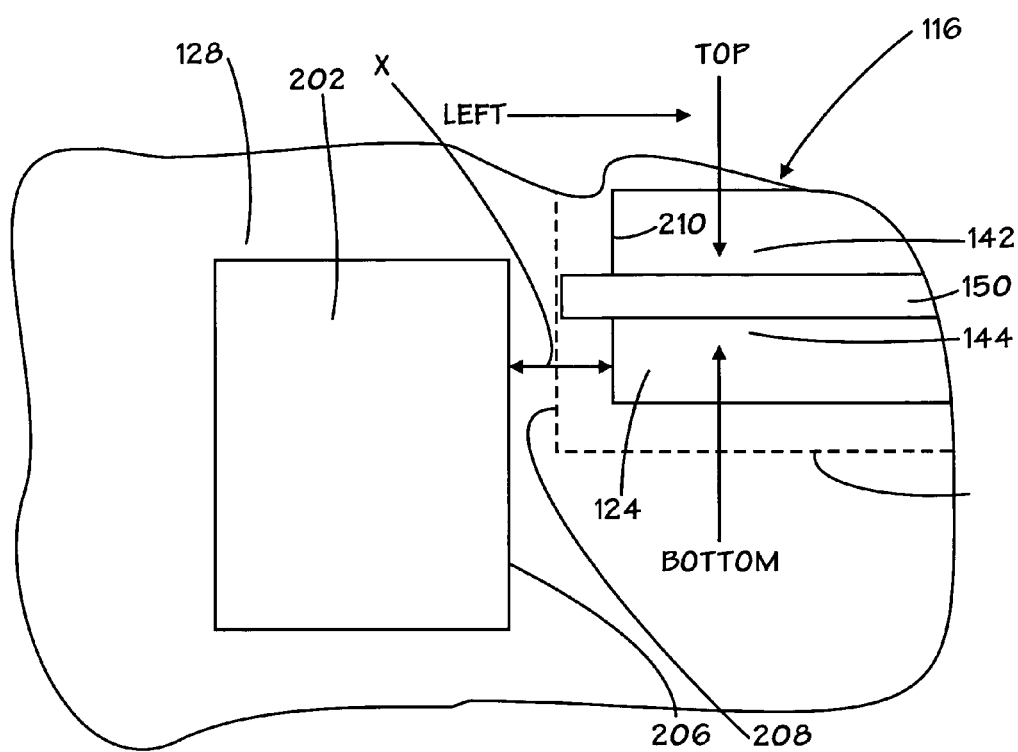
FIG. 12 is a plan view like FIG. 10 but depicts exemplary improvements in device layout in accordance with the present invention.

Aside from providing for halo formation without creating unwanted over-doped halo portions that do not contribute significantly to the desirable functions of a halo region, the process in accordance with the present invention provides an additional benefit by way of enabling somewhat higher density circuit layout. This benefit may be understood by referring now to FIG. 12, which is a plan view of the field effect transistor 116 positioned relative to a hypothetical n-type doped region 202. Isolation structure 128 circumscribes the n-doped region 202 and the transistor 116. Other circuit devices are omitted for simplicity of illustration. The dashed box 204 represents the outline of the opening that will eventually be patterned prior to halo implantation of the device 116. The selection of the lateral spacing X between the active region 124 and the edge 206 of the region 202 is a complex interplay between the selection of the position of the edge 208 of the opening 204, the edge 210 of the active region 124 and the edge 206 of the region 202. In essence, the dimension X is selected so that the edge 208 of the opening 204 may be positioned far enough away laterally from the edge 210 of the active region 124 so that the edge 208 does not shadow the active region 124 during the LEFT direction halo implant but not so far away from the edge 210 so as to overlap the edge 206 and thus expose the region 202 to the halo implant. However, the process in accordance with the present invention eliminates the LEFT direction implant for halo formation for the device 116 and thus other devices that are oriented like the device 116. Thus, the dimension X may be reduced down to the minimum design rule for the applicable fabrication process.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating halo regions for a first group of transistors on a substrate substantially aligned with a first axis and a second group of transistors on the substrate substantially aligned with a second axis that is substantially perpendicular to the first axis, comprising:

forming halo regions for the first group of transistors by implanting the substrate with impurities in a first direction substantially perpendicular to the first axis, and implanting the substrate with impurities in a second direction substantially opposite the first direction and substantially perpendicular to the first axis, and without implanting impurities in a direction substantially parallel to the first axis; and forming halo regions for the second group of transistors by implanting the substrate with impurities in a third direction substantially perpendicular to the second axis, and implanting the substrate with impurities in a fourth direction substantially opposite the third direction and substantially perpendicular to the second axis, and without implanting impurities in a direction substantially parallel to the second axis.

2. The method of claim 1, wherein the first and second groups of transistors comprise n-channel transistors.

3. The method of claim 1, wherein the first group of transistors have a first conductivity type and the second group of transistors comprises a second conductivity type.

4. The method of claim 3, comprising masking one of the first and second groups of transistors while implanting the other of the first and second groups of transistors.

5. The method of claim 1, wherein the implanting impurities in the first and second directions is performed at an angle of about 15 to 45° from vertical.

6. The method of claim 1, wherein the implanting impurities in the third and fourth directions is performed at an angle of about 15 to 45° from vertical.

7. The method of claim 1, wherein the impurities of the halo regions for the first group of transistors comprise boron, $BF_2$ or indium.

8. The method of claim 1, wherein the impurities of the halo regions for the first group of transistors comprise phosphorus, arsenic or antimony.

9. A method of manufacturing, comprising:

forming first and second halo regions for each of a first group of n-channel transistors aligned along a first axis by implanting impurities beneath gate structures of each of the first group of n-channel transistors from first and second substantially opposite directions toward opposite sides of the gate structures of the first group of n-channel transistors;

forming third and fourth halo regions for each of a second group of n-channel transistors aligned along a second axis substantially perpendicular to the first axis by implanting impurities beneath gate structures of each of the second group of n-channel transistors from third and fourth substantially opposite directions toward opposite sides of the gate structures of the second group of n-channel transistors;

forming first and second halo regions for each of a first group of p-channel transistors aligned along the first axis by implanting impurities beneath gate structures of each of the first group of p-channel transistors from first and second substantially opposite directions toward opposite sides of the gate structures of the first group of p-channel transistors;

forming third and fourth halo regions for each of a second group of p-channel transistors aligned along the second axis by implanting impurities beneath gate structures of each of the second group of p-channel transistors from third and fourth substantially opposite directions toward opposite sides of the gate structures of the second group of p-channel transistors; and wherein the first and second halo regions of the first group of n-channel transistors and the first group of p-channel transistors are formed without implanting impurities in a direction substantially perpendicular to the first and second directions, and the third and fourth halo regions of the second group of n-channel transistors and the second group of p-channel transistors are formed without implanting impurities in a direction substantially perpendicular to the third and fourth directions.

10. The method of claim 9, wherein the implanting of impurities in the first, second, third and fourth directions is performed at an angle of about 15 to 45° from vertical.

11. The method of claim 9, wherein the impurities of the comprise boron, $BF_2$ or indium.

12. The method of claim 9, wherein the impurities of the first, second, third and fourth halo regions of the first and second groups of p-channel transistors comprise phosphorus, arsenic or antimony.

* * * * *